United States Patent
Anazawa et al.

(10) Patent No.: US 9,568,987 B2
(45) Date of Patent: Feb. 14, 2017

(54) MEMORY SYSTEM, METHOD OF CONTROLLING MEMORY SYSTEM HAVING VOLATILE MEMORY AND NONVOLATILE MEMORY, AND CONTROLLER

(71) Applicant: KABUSHIKI KAISHA TOSHIBA, Minato-ku (JP)

(72) Inventors: Mitsuru Anazawa, Sagamihara (JP); Toshikatsu Hida, Yokohama (JP); Shohei Asami, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/796,330

(22) Filed: Jul. 10, 2015

(65) Prior Publication Data
US 2016/0266638 A1    Sep. 15, 2016

Related U.S. Application Data

(60) Provisional application No. 62/131,016, filed on Mar. 10, 2015.

(51) Int. Cl.
*G11C 5/14* (2006.01)
*G06F 1/32* (2006.01)
*G06F 3/06* (2006.01)

(52) U.S. Cl.
CPC .............. *G06F 1/3287* (2013.01); *G06F 3/068* (2013.01); *G06F 3/0625* (2013.01); *G06F 3/0634* (2013.01); *G11C 5/14* (2013.01)

(58) Field of Classification Search
CPC .................................... G11C 8/18; G11C 5/14
USPC ............................................... 365/226, 233.5
See application file for complete search history.

(56) References Cited

U.S. PATENT DOCUMENTS

| | | | | |
|---|---|---|---|---|
| 5,789,098 | A * | 8/1998 | Pinder | H02J 7/0068 307/112 |
| 6,266,776 | B1 | 7/2001 | Sakai | |
| 8,019,370 | B2 * | 9/2011 | Sengupta | G06F 1/3209 455/343.5 |
| 9,348,705 | B1 * | 5/2016 | Wu | G06F 11/1469 |
| 9,442,560 | B2 * | 9/2016 | Asami | G06F 1/3287 |
| 2006/0262630 | A1 * | 11/2006 | Ho | G06F 1/26 365/226 |

(Continued)

FOREIGN PATENT DOCUMENTS

| | | |
|---|---|---|
| JP | 11-161385 | 6/1999 |
| JP | 2013-069110 | 4/2013 |

(Continued)

OTHER PUBLICATIONS

U.S. Appl. No. 14/302,835, filed Jun. 12, 2014, Shohei Asami, et al.

*Primary Examiner* — Michael Tran
(74) *Attorney, Agent, or Firm* — Oblon, McClelland, Maier & Neustadt, L.L.P.

(57) ABSTRACT

According to one embodiment, a memory system includes a volatile memory, a nonvolatile memory, and a controller which is configured to turn off a power of the volatile memory after storing data of the volatile memory in the nonvolatile memory in a first mode, turn on the power of the volatile memory in the second mode, and change a first timing as a future timing switching to the first mode based on a second timing as a past timing switching to the second mode.

20 Claims, 11 Drawing Sheets

(56) References Cited

U.S. PATENT DOCUMENTS

| | | | |
|---|---|---|---|
| 2009/0144509 A1* | 6/2009 | Wong | G06F 9/526 |
| | | | 711/147 |
| 2013/0091372 A1 | 4/2013 | Kimura et al. | |
| 2013/0191670 A1 | 7/2013 | Haruki et al. | |
| 2014/0258745 A1* | 9/2014 | Ehrlich | G06F 1/3268 |
| | | | 713/320 |
| 2016/0035433 A1* | 2/2016 | Yang | G11C 17/08 |
| | | | 365/72 |
| 2016/0073343 A1* | 3/2016 | Szewczyk | H04W 52/0216 |
| | | | 370/311 |
| 2016/0148159 A1* | 5/2016 | Coffing | G06Q 10/10 |
| | | | 705/301 |
| 2016/0165422 A1* | 6/2016 | Cholhan | G08B 21/02 |
| | | | 455/404.2 |
| 2016/0174266 A1* | 6/2016 | Goel | H04W 8/005 |
| | | | 455/509 |

FOREIGN PATENT DOCUMENTS

| | | |
|---|---|---|
| JP | 2013-149153 | 8/2013 |
| JP | 2013-206249 | 10/2013 |

* cited by examiner

MEMORY SYSTEM, METHOD OF CONTROLLING MEMORY SYSTEM HAVING VOLATILE MEMORY AND NONVOLATILE MEMORY, AND CONTROLLER

CROSS-REFERENCE TO RELATED APPLICATIONS

This application claims the benefit of U.S. Provisional Application No. 62/131,016, filed Mar. 10, 2015, the entire contents of which are incorporated herein by reference.

FIELD

Embodiments described herein relate generally to a memory system, a method of controlling a memory system having a volatile memory and a nonvolatile memory, and a controller.

BACKGROUND

To reduce power consumption of a memory system, for example, a system-on-a-chip (SOC) comprises a plurality of areas whose power is separated from each other and has the function of switching between an active mode and a sleep mode in accordance with a command from a host. In the sleep mode, a power of a predetermined area of the plurality of areas is shut off to achieve power save.

DETAILED DESCRIPTION

In general, according to one embodiment, a memory system comprises: a volatile memory; a nonvolatile memory; and a controller which is configured to turn off a power of the volatile memory after storing data of the volatile memory in the nonvolatile memory in a first mode, turn on the power of the volatile memory in the second mode, and change a first timing as a future timing switching to the first mode based on a second timing as a past timing switching to the second mode.

1. EMBODIMENT

Figure 1:
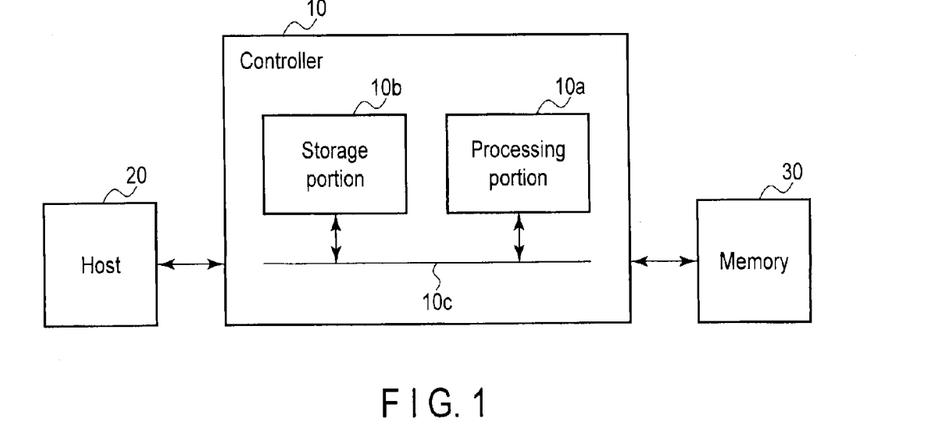
FIG. 1 is a diagram showing an example of a memory system.

FIG. 1 shows an example of a memory system.

The memory system comprises a controller 10, a host 20 and a memory 30. The controller 10 comprises a processing portion 10a, a storage portion 10b and a bus 10c which connects the processing portion 10a and the storage portion 10b to each other. The controller 10 is included in, for example, an SOC.

The processing portion 10a comprises, for example, a CMOS logic circuit, and executes arithmetic processing, etc. The storage portion 10b comprises a volatile memory such as a dynamic random access memory (DRAM) and a static random access memory (SRAM).

For example, the controller 10 has a function of switching between an active mode and a sleep mode to reduce power consumption of the SOC. For example, if a command to execute the sleep mode is transferred from the host 20 to the controller 10, the processing portion 10a in the controller 10 executes processing to transition to the sleep mode.

For example, during a transition time from the active mode to the sleep mode, the processing portion 10a executes processing to move data stored in the storage portion 10b to a memory (evacuation memory) 30. After the move, the processing portion 10a executes, for example, processing to shut off the power in a predetermined area of a plurality of areas in the SOC.

The storage portion 10b is included in the predetermined area.

The storage portion 10b may be provided outside the controller 10 on the condition that the storage portion 10b is included in the predetermined area.

The active mode means that the entire SOC is in an operating state and the sleep mode means that the entire SOC or a predetermined area in the SOC is in a non-operating state. The active mode may mean that a predetermined area in the SOC is in the operating state and the sleep mode may mean that the predetermined area is in the non-operating state.

The operating state means a state where the power is supplied and the non-operating state means a state where the power is shut off.

The memory 30 may be a volatile memory such as a DRAM and an SRAM or a nonvolatile memory such as a NAND flash memory, a magnetic random access memory (MRAM) or a resistive random access memory (ReRAM).

The present embodiment provides a method for determining a timing (sleep transition timing) Ts of a transition to the sleep mode in such a memory system. First, parameters necessary for the determination of sleep transition timing Ts are described.

Figure 2:
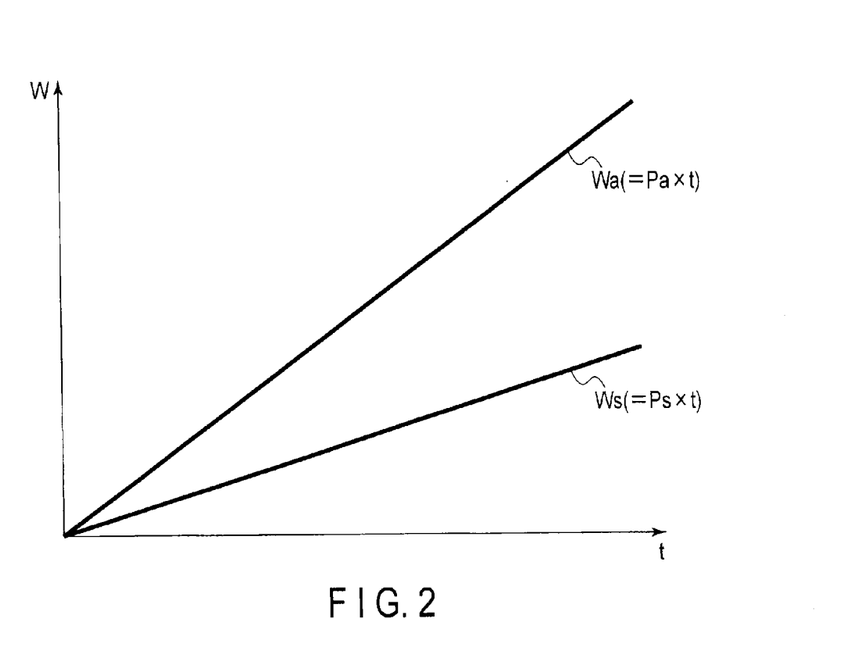
FIG. 2 is a graph showing power consumption in an active mode and a sleep mode.

FIG. 2 shows an example of the power consumption of the memory system in the active mode and the sleep mode.

The horizontal axis represents time t and the vertical axis represents the power consumption.

Wa represents a variation of power consumption in the active mode. The power consumption Wa in the active mode is represented by a value obtained by multiplying power consumption Pa per unit time in the active mode by time t.

Ws represents a variation of power consumption in the sleep mode. The power consumption Ws in the sleep mode is represented by a value obtained by multiplying power consumption Ps per unit time in the sleep mode by time t.

The number of circuits in the operating state in the sleep mode is larger than the number of circuits in the operating state in the active mode. Therefore, Pa is greater than Ps and the slope of Wa is larger than the slope of Ws.

Figure 3:
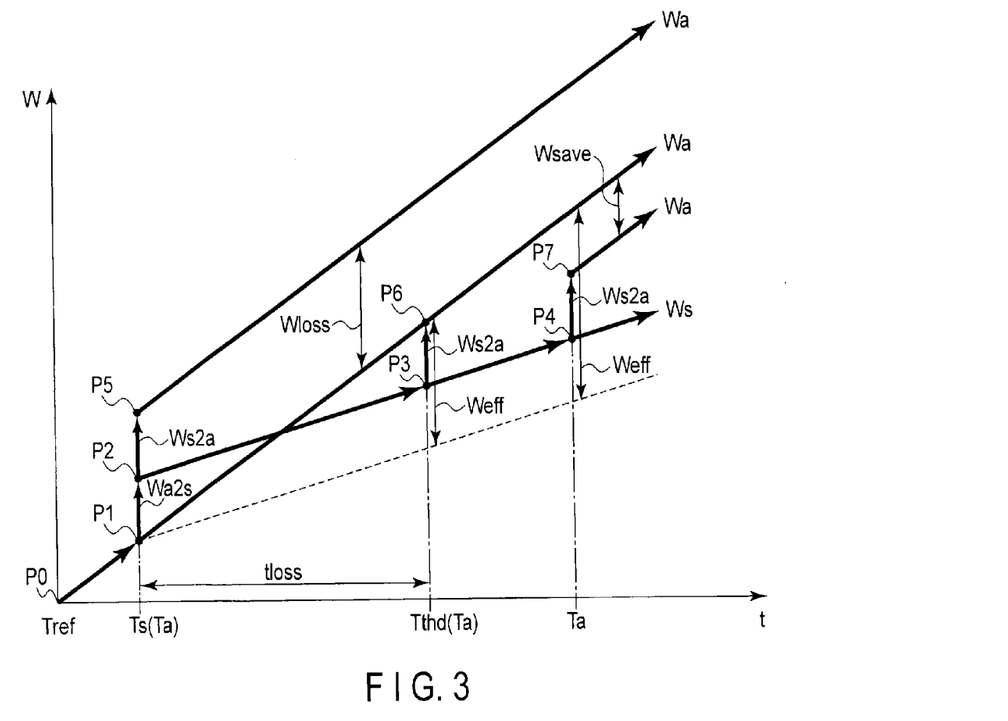
FIG. 3 is a graph showing an example of power consumption in the case of switching the active mode to the sleep mode.

FIG. 3 shows an example of the power consumption of the memory system in the case of switching the active mode to the sleep mode.

Tref represents a reference time. The reference time Tref serves as a reference for timings to be hereinafter described. The reference time Tref may be set at any time point on the time axis t which specifies the operation of the memory system.

However, the reference time Tref should preferably be set at, for example, a time when the power is supplied to the memory system or the SOC, a time when the SOC is switched from the sleep mode to the active mode and a time when a command such as a read command and a write command is transferred from the host to the controller.

If the SOC is consistently in the active mode from the reference time Tref, the power consumption W of the memory system increases along the line Wa (corresponding to Wa in FIG. 2) (P0→P1→P6).

In contrast, a case where the SOC is switched from the active mode to the sleep mode at sleep transition timing Ts is considered.

In the present embodiment, a transition time from the active mode to the sleep mode is not considered to simplify the description. A power (power loss) produced at the transition time (zero in the graph) from the active mode to the sleep mode is Wa2s.

A transition time from the sleep mode to the active mode is not considered either. A power (power loss) produced at the transition time (zero in the graph) from the sleep mode to the active mode is Ws2a.

For example, if the SOC is switched from the active mode to the sleep mode at sleep transition timing Ts, the power loss Wa2s is produced and the power consumption of the memory system increases (P0→P1→P2). After that, since the SOC enters the sleep mode, the power consumption W of the memory system increases along the line Ws (corresponding to Ws in FIG. 2) (P2→P3→P4).

Active transition timing Ta is described below.

Active transition timing Ta represents a timing of a transition to the active mode. For example, when a command is transferred from the host to the controller while the SOC is in the sleep mode, the SOC is switched from the sleep mode to the active mode. The effect of the sleep mode is widely varied according to the position of active transition timing Ta.

For example, when a command is transferred from the host to the controller at approximately the same time as the SOC enters the sleep mode, sleep transition timing Ts is approximately the same as active transition timing Ta, and the power loss Ws2a is produced in addition to the power loss Wa2s (P2→P5).

In this case, therefore, the power loss Wloss (=Wa2s+Ws2a) is produced and the power consumption W of the memory system increases along the line Wa (corresponding to Wa in FIG. 2).

A case where a command is transferred from the host to the controller at a time point (P4) when sufficient time has passed since the SOC entered the sleep mode is considered.

In this case, the power loss Ws2a is produced and the power consumption of the memory system increases (P4→P7) at active transition timing Ta. After that, since the SOC enters the active mode, the power consumption W of the memory system increases along the line Wa (corresponding to Ws in FIG. 2).

The SOC is in the sleep mode during a period from P2 to P4. That is, the SOC can achieve the effect of the sleep mode, i.e., the power save Weff. The power save Weff is larger than the power loss (=Wa2s+Ws2a) produced at sleep transition timing Ts and active transition timing Ta.

In this case, therefore, the effect of the transition to the sleep mode, i.e., the power save Wsave (=Weff−Wa2s+Ws2a) can be achieved.

Based on the above, it is assumed that a threshold for determining whether the effect of the transition to the sleep mode is negative (i.e., the power loss Wloss is produced) or positive (i.e., the power save Wsave is produced) is between the above two active transition timings Ta. In the present embodiment, the threshold is represented by threshold timing Tthd.

A case where a command is transferred from the host to the controller at threshold timing Tthd after the SOC enters the sleep mode is considered.

In this case, the power loss Ws2a is produced and the power consumption of the memory system increases (P3→P6) at active transition timing Ta (=Tthd). After that, since the SOC enters the active mode, the power consumption W of the memory system increases along the line Wa (corresponding to Ws in FIG. 2). The SOC is in the sleep mode during a period from P2 to P3. That is, the SOC can achieve the effect of the sleep mode, i.e., the power save Weff.

The power save Weff is equal to the power loss (=Wa2s+Ws2a) produced at sleep transition timing Ts and active transition timing Ta.

In this case, therefore, the effect of the transition to the sleep mode, i.e., the power save Wsave (=Weff−Wa2s+Ws2a) is zero.

Figure 4:
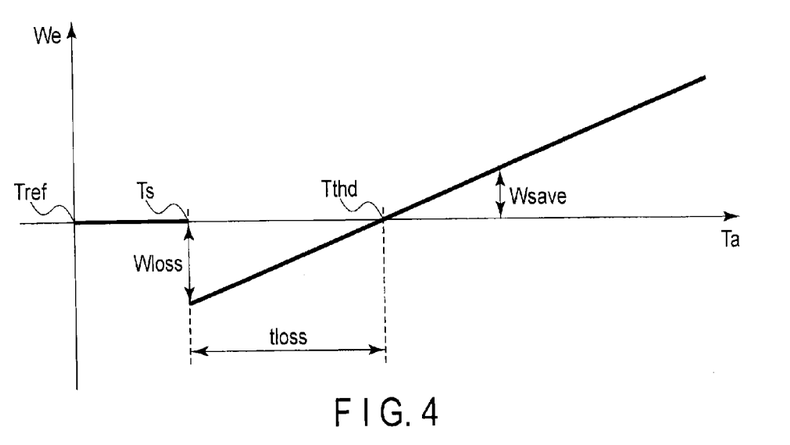
FIG. 4 is a graph showing the relationship between the effect of the sleep mode and a threshold timing.

FIG. 4 shows the relationship between the effect We of the sleep mode and threshold timing Tthd.

The horizontal axis represents active transition timing Ta and the vertical axis represents the effect We of the sleep mode on the low power consumption. The effect We on the low power consumption is represented by (Pa−Ps)×(Ta−Tthd).

It should be noted that Pa is the power consumption per unit time in the active mode and Ps is the power consumption per unit time in the sleep mode.

In FIG. 4, the range of active transition timing Ta being lower than sleep transition timing Ts indicates that the SOC does not enter the sleep mode. Therefore, We is zero within the range.

According to FIG. 4, the effect We of the sleep mode is negative during a period Tloss from sleep transition timing Ts to threshold timing Tthd. That is, the power consumption adversely increases by the transition to the sleep mode during the period Tloss.

The effect We of the sleep mode becomes positive on condition that active transition timing Ta is later than threshold timing Tthd. However, active transition timing Ta is determined by a command from the host and cannot be determined by the SOC.

Therefore, the present embodiment provides a sleep mode algorithm that dynamically changes sleep transition timing Ts based on the past active transition timing Ta such that active transition timing Ta does not occur during the period tloss, i.e., active transition timing Ta occurs later than threshold timing Tthd.

Figure 5:
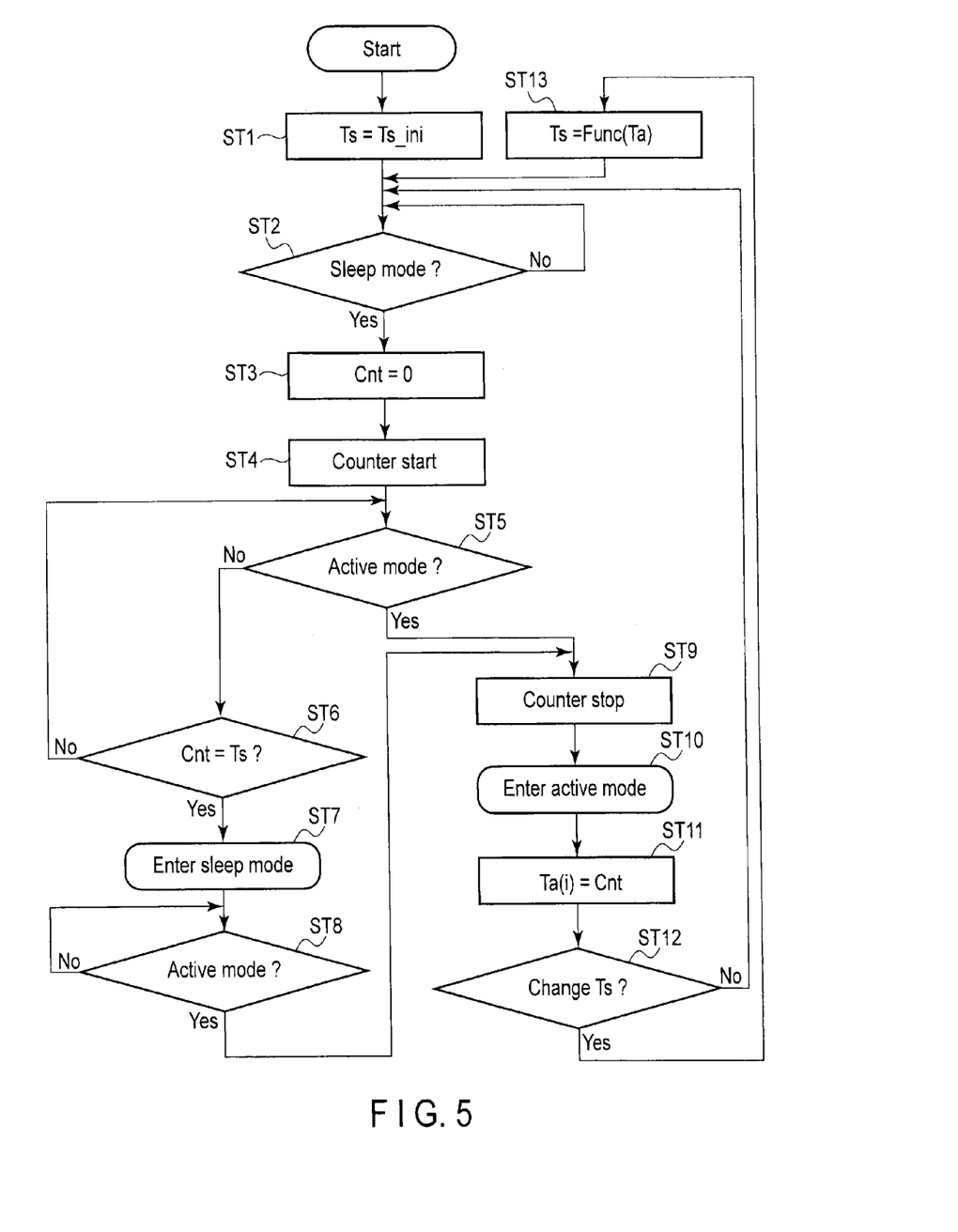
FIG. 5 is a flowchart showing an example of a sleep mode algorithm.

FIG. 5 shows an example of the sleep mode algorithm.

The algorithm shows a method of dynamically changing sleep transition timing Ts in order to achieve the maximum effect of the sleep mode on the low power consumption.

Generally, sleep transition timing Ts is fixed in the memory system. In contrast, the present embodiment aims to reduce the power consumption of the memory system by making sleep transition timing Ts variable and setting sleep transition timing Ts at an optimum value based on the situation of the memory system (situation of previous command issue).

First, initial value Ts-ini of sleep transition timing Ts is set (step ST1).

Initial value Ts-ini of Ts is prestored, for example, in the SOC.

Next, whether a transition to the sleep mode is executed or not is confirmed (step ST2).

The transition to the sleep mode is executed, for example, when a command to request the transition to the sleep mode is issued from the host to the SOC and when the SOC determines that it is preferable to enter the sleep mode. The latter is effective without any request from the host when there is no work or no urgent work in the SOC.

If the transition to the sleep mode is executed, a count is started from the reference time Tref (steps ST3 to ST4).

Tref is set at, for example, the time when a transition to the sleep mode is determined to be executed, i.e., when the SOC receives a command to transition to the sleep mode and when the SOC determines that it is preferable to enter the sleep mode in the above example.

The subsequent steps are different according to a timing of a transition to the active mode, i.e., active transition timing Ta.

Ta occurs, for example, when a new command other than the command to request the transition to the sleep mode is issued from the host to the SOC and when the SOC determines that it is preferable to enter the active mode. The latter means that there is a work or an urgent work in the SOC even if the host does not issue a new command.

If Ta is Later than Ts

When the count started in step ST4 becomes equal to Ts, a transition to the sleep mode is executed (steps ST5 to ST7).

After that, if active transition timing Ta occurs and a transition to the active mode is confirmed, the count started in step ST4 is stopped (steps ST8 to ST9).

Then, a transition from the sleep mode to the active mode is actually executed (step ST10).

The value (count) of Ta in step ST8 is stored as Ta (i) to be a sample for determining future Ts (step ST11).

Finally, whether to change Ts or not is confirmed (step ST12).

If Ts is changed, the new Ts (=Func(Ta)) is determined based on the value of Ta stored in step ST11, i.e., the previous value of Ta or a plurality of past values of Ta (which may include the previous value of Ta), and the new Ts is hereafter used as sleep transition timing (step ST13).

The new Ts is set such that the next active transition timing Ta does not occur during a certain period (period Tloss in FIG. 4) from the new Ts, i.e., such that a probability that the next active transition timing Ta occurs is the minimum in the certain period.

In contrast, if Ts is not changed (i.e., if Ta is stored just as a sample), past Ts is used and the processing returns to step ST2.

If Ta is Earlier than Ts

Active transition timing Ta occurs before the count started in step ST4 becomes equal to Ts (step ST5).

If a transition to the active mode is confirmed, the count started in step ST4 is stopped (step ST9). Then, a transition from the sleep mode to the active mode is actually executed (step ST10).

The value (count) of Ta in step ST5 is stored as Ta (i) to be a sample for determining future Ts (step ST11).

Finally, whether to change Ts or not is confirmed (step ST12).

If Ts is changed, the new Ts (=Func(Ta)) is determined based on the value of Ta stored in step ST11, i.e., the previous value of Ta or a plurality of past values of Ta (which may include the previous value of Ta), and the new Ts is hereafter used as sleep transition timing (step ST13).

In contrast, if Ts is not changed (i.e., if Ta is stored just as a sample), past Ts is used and the processing returns to step ST2.

In the above-described algorithm, whether to change Ts or not (step ST12) should preferably be determined based on, for example, a period and the number of occurrences of Ta.

Ts may be changed, for example, when a certain period has passed since Ts was first set (step ST1) and when a certain period has passed since the new Ts was set (step ST13).

Ts may be changed, for example, when Ta occurs a certain number of times since Ts was first set (step ST1) and when Ta occurs a certain number of times since the new Ts was set (step ST13).

Ts may be changed every time Ta (previous Ta) occurs.

A concrete example of determining sleep transition timing Ts is hereinafter described.

If no command or few commands are issued from the host, a value of sleep transition timing Ts, for example, a period from Tref to Ts in FIG. 3 or FIG. 4 should preferably be minimized. This is because the period of the sleep mode becomes longer as the sleep transition timing Ts becomes shorter.

However, a certain number of commands are generally issued from the host. If a period of the sleep mode can be unlimitedly lengthened in this case, for example, a command may be issued immediately after the transition to the sleep mode, which may adversely reduce the effect on the low power consumption. Therefore, lower limit Ts_min of sleep transition timing Ts is first set. For example, lower limit Ts_min is set with reference to a time when a command is transferred from the host to the controller (including a time when the sleep mode is switched to the active mode) and determined in consideration of the situation of past command issue.

If a memory on which data is saved is a NAND flash memory, lower limit Ts_min of sleep transition timing Ts may be determined in consideration of the degree of wearing of the NAND flash memory. For example, since the degree of wearing of the NAND flash memory becomes higher as the number of transitions to the sleep mode increases, lower limit Ts_min may be set to limit the number of transitions to the sleep mode.

Lower limit Ts_min of sleep transition timing Ts may be fixed or variable according to the situation of past command issue, etc.

As described above, a timing when the host issues a command is not uniquely determined. However, a timing when the host issues a command can be predicted up to a certain point based on the situation of past command issue.

Therefore, initial value Ts_ini of sleep transition timing Ts is set at a certain value greater than or equal to lower limit Ts_min in accordance with the algorithm shown in FIG. 5. For example, the certain value is a time when a certain period has passed since the controller received a command from the host, on condition that a new command is not received during the certain period.

In accordance with the algorithm shown in FIG. 5, sleep transition timing Ts is arbitrarily changed to Ts_new based on active transition timing Ta.

Figure 6:
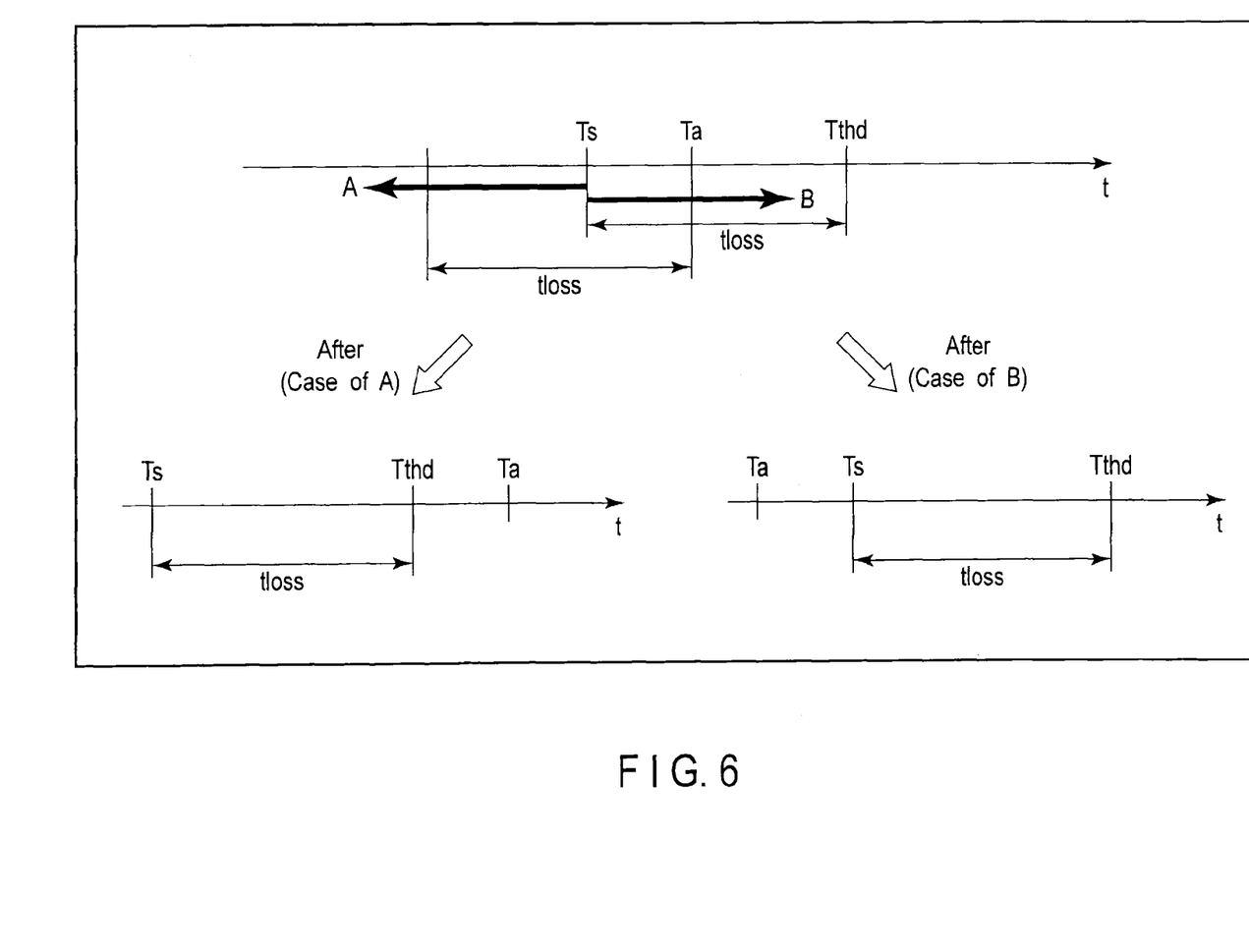
FIG. 6, FIG. 7A, FIG. 7B, FIG. 7C and FIG. 7D are graphs showing examples of a change of Ts.

For example, in the example of FIG. 6, the previous active transition timing Ta occurs within period Tloss from sleep transition timing Ts to threshold timing Tthd. If Ts is not changed in this case, there is a high possibility that the next active transition timing Ta also occurs within period Tloss and the power consumption adversely increases per transition to the sleep mode.

Therefore, sleep transition timing Ts is changed in accordance with the algorithm shown in FIG. 5. That is, Ts (=Ts_new) is set to be separated from Ta by tloss or more in the direction in which a value of Ts becomes lower as indicated by arrow A in FIG. 6.

A possibility that the next active transition timing Ta occurs outside period Tloss from Ts to Tthd thereby increases as shown in case of A in FIG. 6. Therefore, the positive effect of the sleep mode on the low power consumption can be expected next time.

The same effect can be achieved if sleep transition timing Ts (=Ts_new) is set to be separated from Ta by tloss or more in the direction in which a value of Ts becomes higher as indicated by arrow B in FIG. 6.

That is, a transition to the sleep mode occurs later than the next active transition timing Ta as shown in case of B in FIG. 6. This means that there is a high possibility that active transition timing Ta does not occur during period Tloss from Ts to Tthd. Therefore, the positive effect of the sleep mode on the low power consumption can be expected next time.

FIG. 7A, FIG. 7B, FIG. 7C and FIG. 7D show other examples of determining sleep transition timing Ts with respect to active transition timing Ta predicted to occur next.

Active transition timing Ta predicted to occur next may be determined based on the previous active transition timing Ta or based on a plurality of past active transition timings Ta (including previous Ta).

Figure 7A:
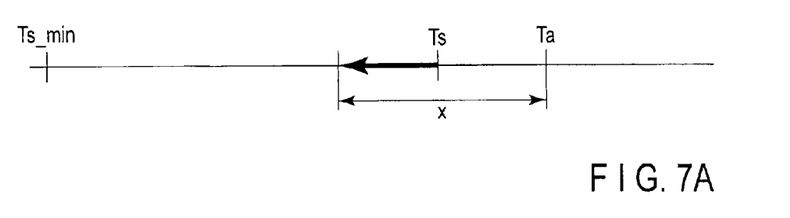

In the example of FIG. 7A, next Ta is predicted to occur close to Ts.

In this case, considering that commands are transmitted from the host collectively up to a certain point, there is a high possibility that a new command is issued immediately after the transition to the sleep mode at sleep transition timing Ts and the power consumption adversely increases per transition to the sleep mode similarly to the above-described example.

Therefore, if a temporal difference between active transition timing Ta and sleep transition timing Ts is within a predetermined range as shown in the example of FIG. 7A, Ts is changed such that Ta and Ts are separated from each other by arbitrary time x exceeding the predetermined range.

For example, sleep transition timing Ts (=Ts_new) is set to be separated from Ta by time x in the direction in which a value of Ts becomes lower. Time x is, for example, greater than or equal to tloss in FIG. 6. In this case, there is a high possibility that the next active transition timing Ta is separated from sleep transition timing Ts by time x. Therefore, the positive effect of the sleep mode on the low power consumption can be expected next time.

Figure 7B:
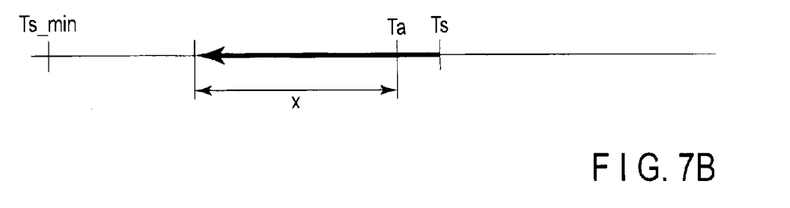

In the example of FIG. 7B, too, next Ta is predicted to occur close to Ts. In the example of FIG. 7B, however, next Ta is predicted to occur before Ts.

In this case, Ta predicted to occur after Ts is sufficiently later than Ts.

Therefore, if active transition timing Ta is earlier than sleep transition timing Ts as shown in the example of FIG. 7B, Ta and Ts are separated from each other by arbitrary time x and Ts is moved to be earlier than Ta in order to obtain the sufficient low power consumption effect before Ta occurs.

For example, sleep transition timing Ts (=Ts_new) is set to be separated from Ta by time x in the direction in which a value of Ts becomes lower. Time x is, for example, greater than or equal to tloss in FIG. 6. Similarly to FIG. 7A, in this case, there is a high possibility that next active transition timing Ta is separated from sleep transition timing Ts by time x. Therefore, the positive effect of the sleep mode on the low power consumption can be expected next time.

Figure 7C:
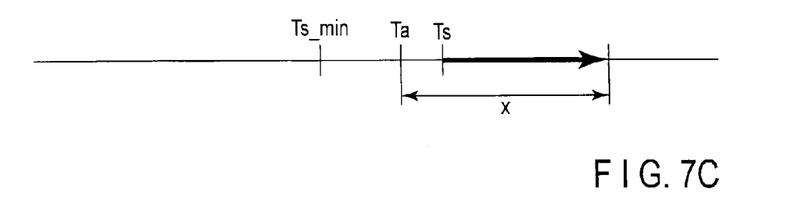

Similarly to the example of FIG. 7B, next Ta is predicted to occur close to Ts in the example of FIG. 7C.

In this case, considering that commands are transmitted from the host collectively up to a certain point similarly to the example of FIG. 7A, there is a high possibility that a new command is issued immediately after the transition to the sleep mode at sleep transition timing Ts.

Therefore, in the example of FIG. 7C, too, if a temporal difference between active transition timing Ta and sleep transition timing Ts is within a predetermined range, Ts is changed such that Ta and Ts are separated from each other by arbitrary time x exceeding the predetermined range.

For example, sleep transition timing Ts (=Ts_new) is set to be separated from Ta by time x in the direction in which a value of Ts becomes higher. In this case, there is a high possibility that the next sleep transition timing Ts is separated from active transition timing Ta by time x. Therefore, the positive effect of the sleep mode on the low power consumption can be expected next time.

Figure 7D:
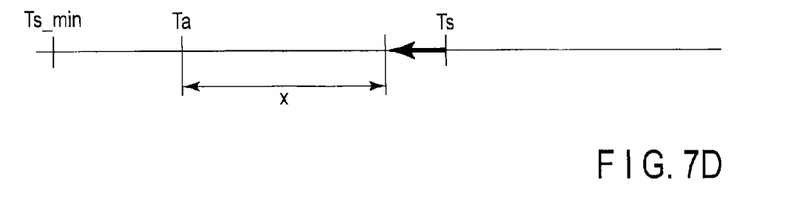

Finally, in the example of FIG. 7D, next Ta is predicted to occur within a predetermined range from Ts and the sufficient low power consumption effect has been previously achieved within this range.

In this case, if Ts is widely changed, there is a possibility that the low power consumption effect which has been achieved before cannot be achieved.

Therefore, in the example of FIG. 7D, sleep transition timing Ts is adjusted just a little. That is, sleep transition timing Ts is slightly changed such that active transition timing Ta and sleep transition timing Ts are separated from each other by arbitrary time x within the predetermined range.

For example, sleep transition timing Ts (=Ts_new) is separated from Ta by time x in the direction in which a value of Ts becomes lower. In this case, there is a high possibility that the next sleep transition timing Ts is separated from active transition timing Ta by time x. Therefore, the positive effect of the sleep mode on the low power consumption can be expected next time.

Figure 8:
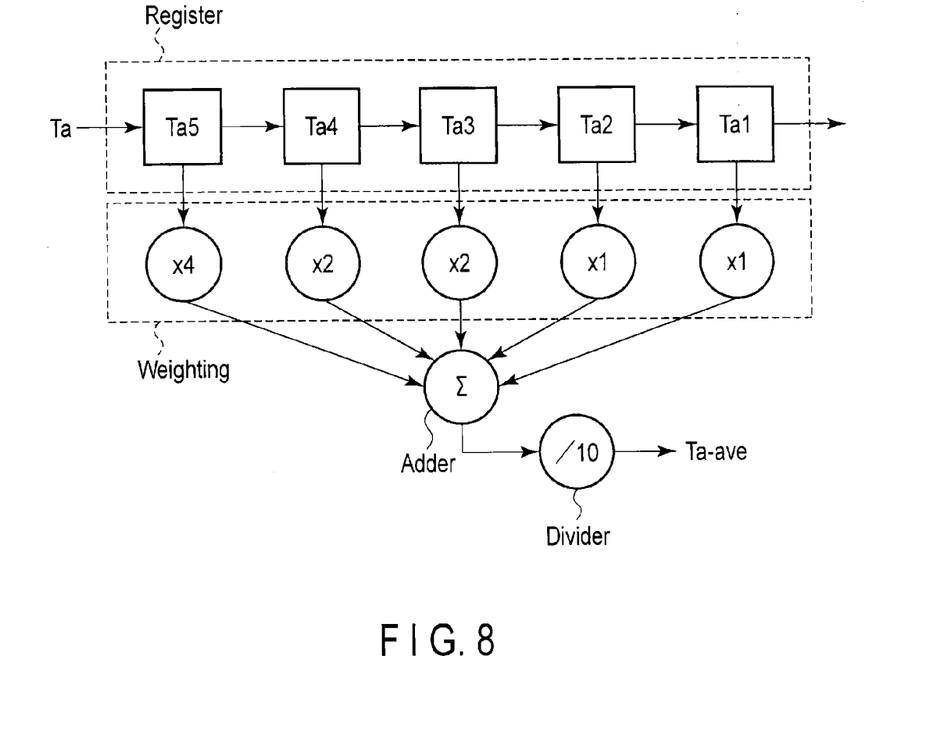
FIG. 8 is a diagram showing an example of obtaining a weighted average of a plurality of active transition timings Ta.

FIG. 8 shows an example of obtaining a weighted average of a plurality of active transition timings Ta.

In the present example, the next active transition timing Ta is predicted based on a plurality of past active transition timings Ta and sleep transition timing Ts is determined based on the result of the prediction.

The next active transition timing Ta can be predicted more accurately by referring to a plurality of past active transition timings Ta.

Commands of the same type are often issued collectively from the host. This means that the newer of a plurality of past active transition timings Ta is more important for the prediction of the next active transition timing Ta.

Therefore, in the present example, weighted average processing, i.e., processing of weighting a plurality of past active transition timings Ta and averaging the weighted timings is executed.

For example, past five active transition timings Ta are stored in the register as shown in FIG. 8. Reference numbers Ta1, Ta2, Ta3, Ta4 and Ta5 are assigned to the past five active transition timings Ta in the order from the oldest active transition timing Ta to the newest active transition timings Ta.

In this case, weighting is applied by, for example, multiplying Ta1 and Ta2 by 1, multiplying Ta3 and Ta4 by 2, and multiplying Ta5 by 4. An adder calculates the sum of the values and a divider calculates the average.

Based on the result, the next active transition timing Ta is predicted and sleep transition timing Ts is determined such that the effect on the low power consumption is achieved in the sleep mode.

The next active transition timing Ta may be predicted by simply averaging a plurality of past active transition timings Ta instead of obtaining a weighted average.

Figure 9:
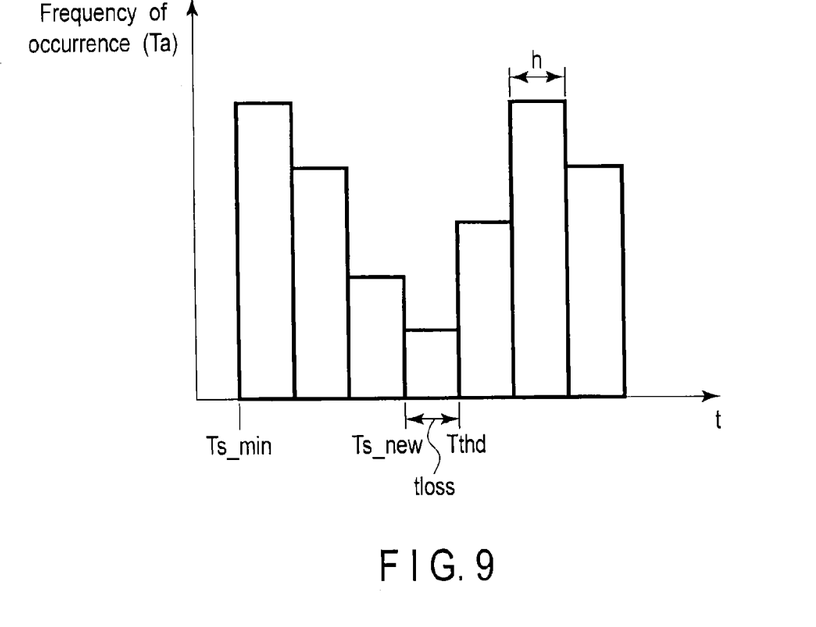
FIG. 9 and FIG. 10 are histograms of active transition timings.
Figure 10:
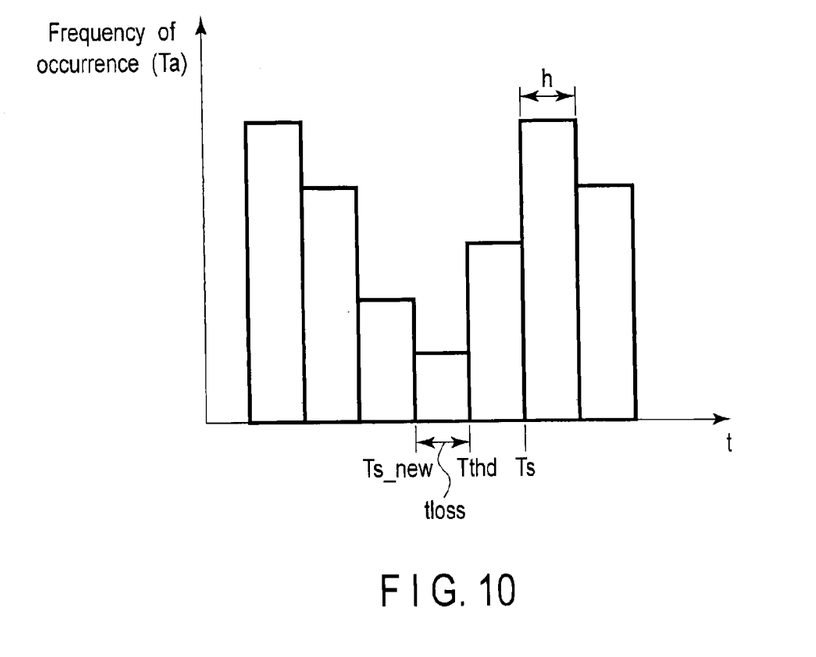

FIG. 9 and FIG. 10 show examples of preparing a histogram of a plurality of active transition timings Ta.

The horizontal axis represents time t and the vertical axis represents the frequency of occurrence of active transition timings.

The width of each of a plurality of bins, which are seven bins in the present example, is h. Width h may be fixed or variable. As width h of each bin becomes smaller, the occurrence of a plurality of past active transition timings Ta can be understood more accurately and more suitable sleep transition timing Ts can be determined.

FIG. 9 shows an example of preparing a histogram of a plurality of active transition timings Ta with reference to Ts_min. FIG. 10 shows an example of preparing a histogram of a plurality of active transition timings Ta with reference to present Ts.

In each case, if the next active transition timing Ta occurs within period tloss from the next sleep transition timing Ts to the next threshold timing Tthd, the power loss caused by the transition between the active mode and the sleep mode exceeds the power save, which needs to be avoided as much as possible.

Therefore, the next sleep transition timing Ts is determined based on the histogram such that the effect of the transition to the sleep mode on the low power consumption is achieved.

For example, as shown in FIG. 9 and FIG. 10, a probability of occurrence of the next sleep transition timing Ts is predicted to be the minimum in a range of the minimum frequency of occurrence of active transition timings Ta. The present sleep transition timing Ts is changed to the new sleep transition timing Ts_new such that period tloss overlaps the range of the minimum frequency of occurrence of active transition timings Ta.

Width h of each bin is equal to period tloss in the present example, but these may be different from each other.

The probability that the next active transition timing Ts occurs within period tloss in the next transition to the sleep mode thereby becomes lower and the effect of the sleep mode on the low power consumption can be expected.

If width h of each bin is variable, weighting may be applied for each bin. That is, a weighting assigned to a bin having a small width h may be increased and a weighting assigned to a bin having a large width h may be reduced.

The example of FIG. 8 may be combined with FIG. 9 and FIG. 10. That is, a histogram may be prepared in consideration of the result of weighting of a plurality of active transition timings Ta based on occurrence times of the timings.

As described above, according to the embodiment, power consumption can be reduced by the sleep mode by optimizing a sleep transition timing. A needless transition in which the power save obtained in the sleep mode is less than the power loss produced in a transition time from the active mode to the sleep mode can be reduced.

In a transition time from the active mode to the sleep mode, power loss is produced in order to move data stored in a storage portion (volatile memory) in the SOC to an evacuation memory. Therefore, if a period of the sleep mode becomes short by a command issued from the host immediately after the transition to the sleep mode, the power loss produced in the transition time exceeds the power save obtained by the sleep mode. As a result, the power consumption is increased.

In the present embodiment, such a needless transition can be reduced.

In the present embodiment, if the evacuation memory is a NAND flash memory, needless writing to the evacuation memory can be avoided and the life of the evacuation memory can be increased.

2. EXAMPLE OF APPLICATION

An example of a data storage device to which the above embodiment can be applied and a computer system comprising the data storage device is hereinafter described.

Figure 11:
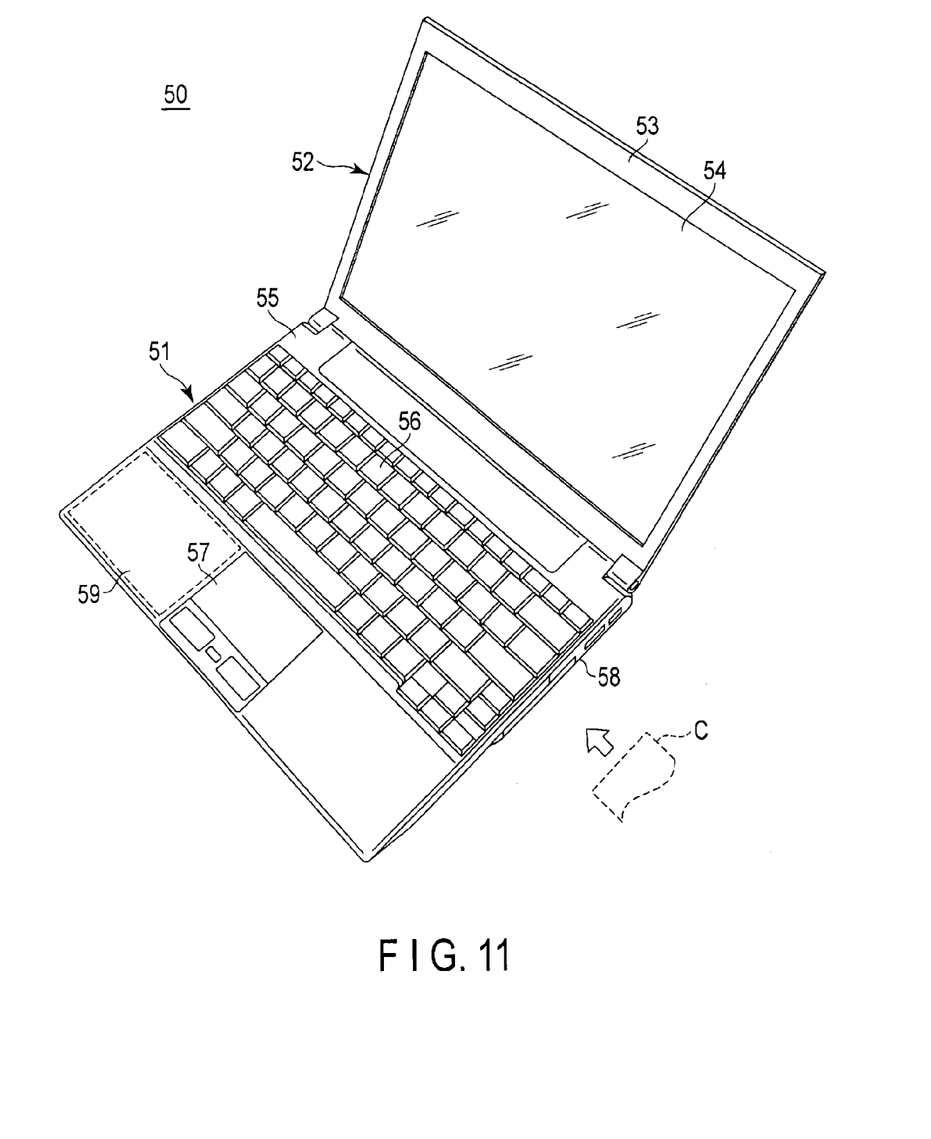
FIG. 11 is an illustration showing an example of application to a portable computer.

FIG. 11 shows an example of a portable computer equipped with a data storage device.

A portable computer 50 comprises a body 51 and a display unit 52. The display unit 52 comprises a display housing 53 and a display device 54 housed in the display housing 53.

The body 51 comprises a housing 55, a keyboard 56 and a touchpad 57 serving as a pointing device. The housing 55 comprises a main circuit board, an optical disk device (ODD) unit, a card slot 58, a data storage device 59, etc.

The card slot 58 is provided on the side surface of the housing 55. The user can insert an additional device C into the card slot 58 from the outside of the housing 55.

The data storage device 59 is, for example, a solid-state drive (SSD). The SSD may be used, mounted inside the portable computer, as a substitute for a hard disk drive (HDD) or may be used as an additional device C. The data storage device 59 comprises the controller and the evacuation memory in the above-described embodiment.

Figure 12:
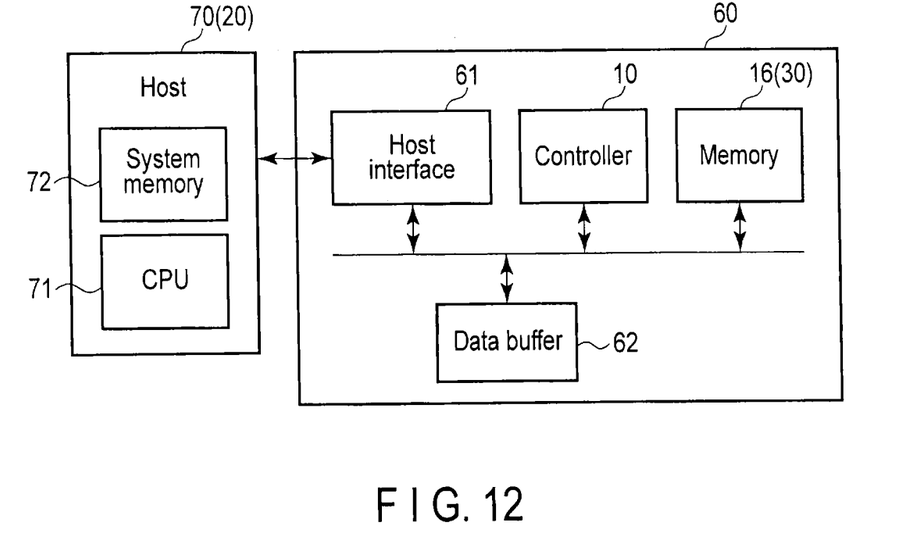
FIG. 12 is a diagram showing an example of application to a data storage device.

FIG. 12 shows an example of the data storage device.

A data storage device 60 is, for example, an SSD and comprises a host interface 61, a controller 10, a memory (for example, a nonvolatile semiconductor memory) 16 (30) and a data buffer 62.

The host interface 61 functions as an interface between a host 70 (20) and the data storage device 60. The host 70 comprises a CPU 71 and a system memory 72.

The memory 16 (30) is, for example, a NAND flash memory. The memory 16 (30) corresponds to the memory 30 of FIG. 1. The data buffer 62 is, for example, a DRAM, SRAM, MRAM or ReRAM. That is, the data buffer 62 may be a random access memory faster than the memory 16 (30) serving as a storage memory.

The controller 10 controls reading, writing and erasing of data in the memory 16 (30). The controller 10 corresponds to the controller 10 of FIG. 1 and the host 70 (20) corresponds to the host 20 of FIG. 1.

Figure 13:
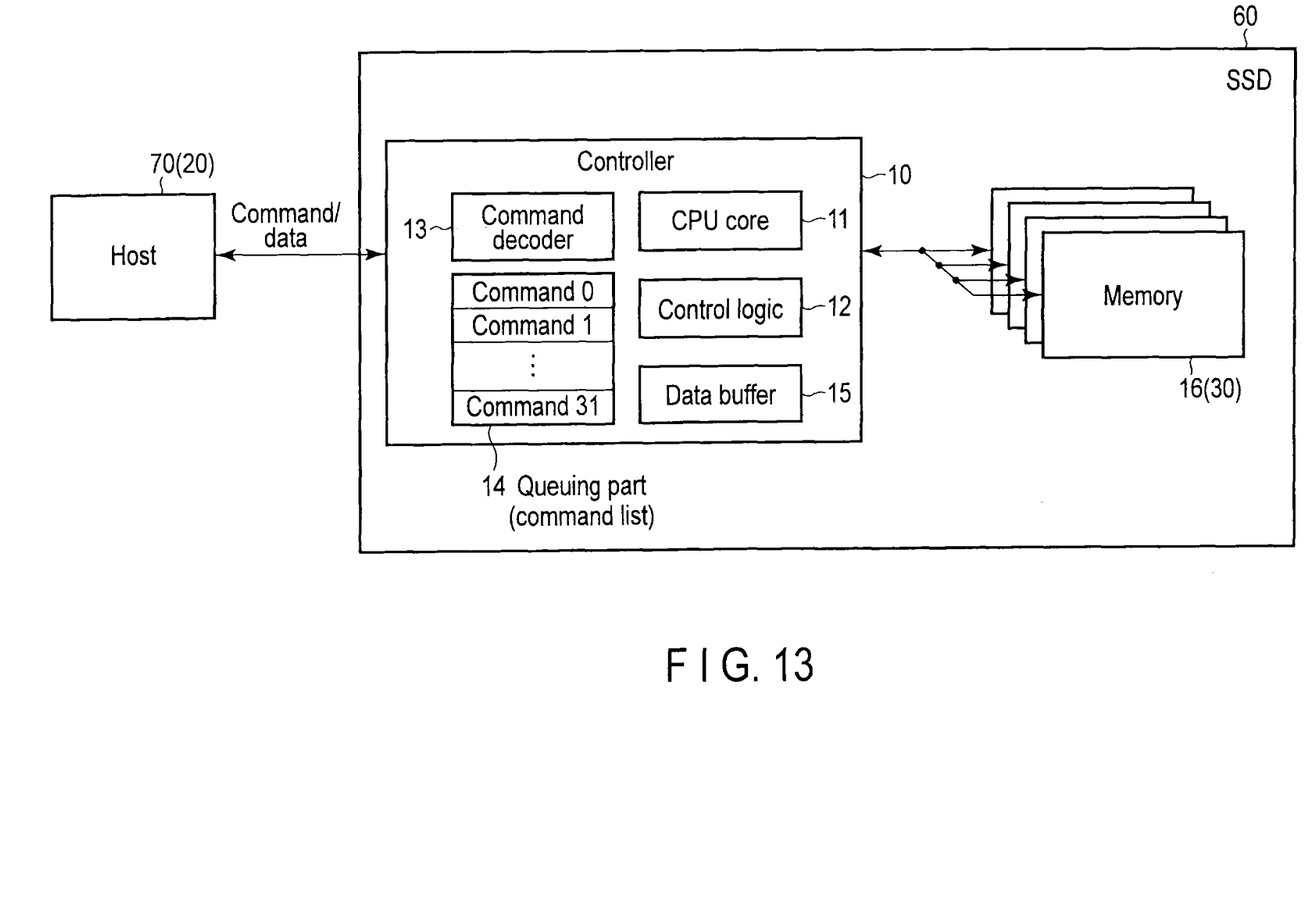
FIG. 13 is a diagram showing details of the storage device of FIG. 12.

FIG. 13 shows details of the data storage device of FIG. 12.

In FIG. 13, the same elements as those of FIG. 12 are expressed by the same reference numbers.

The data storage device 60 comprises a controller 11 and a memory 16 (30). The controller 11 comprises a CPU core 11, a control logic 12, a command decoder 13, a queuing part (command list) 14 and a data buffer (buffer memory) 15.

A plurality of commands transferred from the host 70 (20) are registered to the queuing part 14 in the controller 10 via the command decoder 13. Data related to the commands is temporarily stored in the data buffer 15. The data buffer 15 is, for example, an SRAM. The commands registered to the queuing part 14 are sequentially processed based on tag numbers.

The command logic 12 is, for example, a logic circuit to execute processing directed by the CPU core 11.

The data buffer 15 may be provided outside the controller 10. In this case, the data buffer 62 of FIG. 12 may be used instead of the data buffer 15 of FIG. 13.

Figure 14:
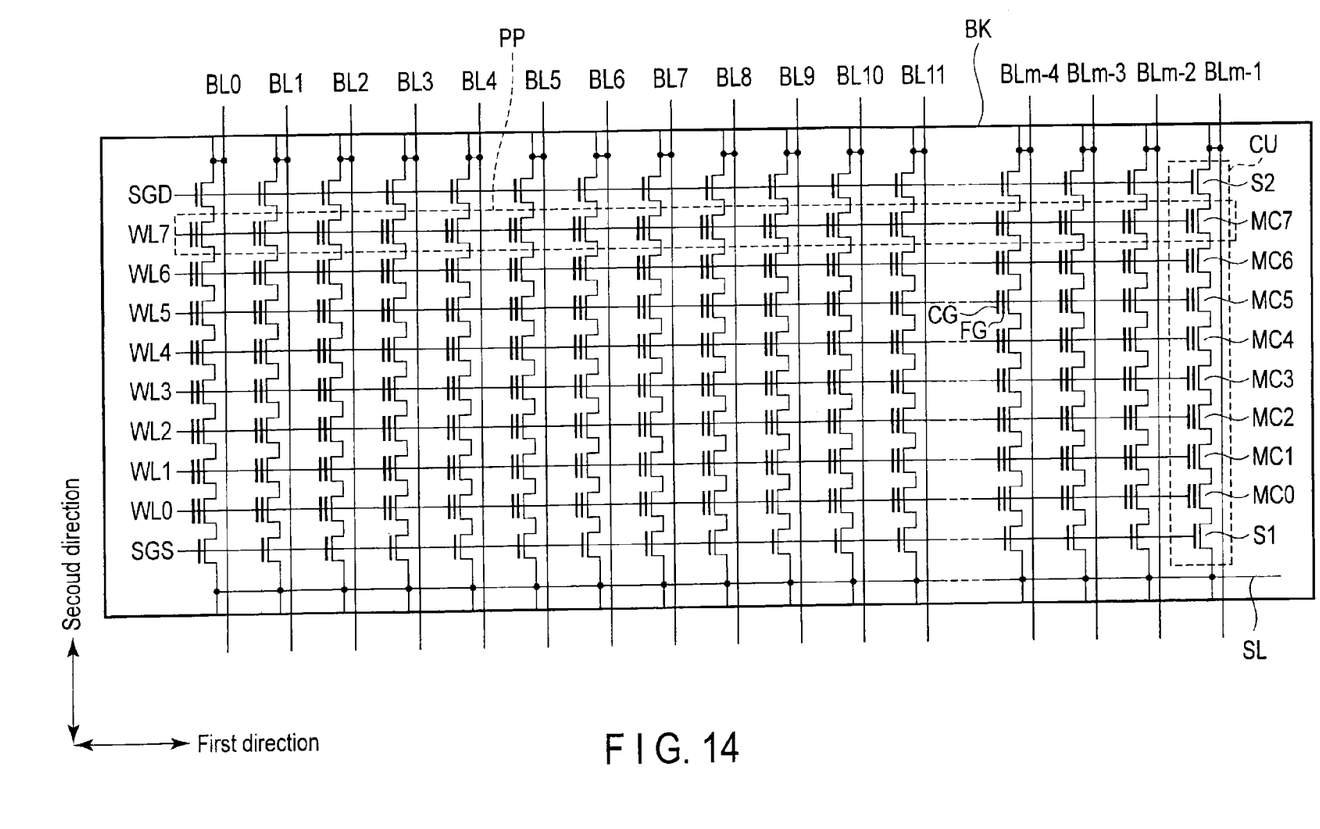
FIG. 14 is an illustration showing an example of a NAND flash memory.

FIG. 14 shows an example of a NAND flash memory.

The NAND flash memory is used as, for example, the memory 16 (30) of FIG. 12 or FIG. 13.

The NAND flash memory includes a block BK.

The block BK comprises a plurality of cell units CU arranged in the first direction. Each cell unit CU comprises a memory cell string extending in the second direction intersecting the first direction, a transistor S1 connected to an end of a current path of the memory cell string and a select transistor S2 connected to the other end of the current path of the memory cell string. The memory cell string comprises eight memory cells MC0 to MC7 of which current paths are connected in series.

A memory cell MCk (k is an integer between 0 and 7) comprises a charge storage layer (for example, a floating gate electrode) FG and a control gate electrode CG.

A memory cell unit CU comprises eight memory cells MC0 to MC7 in the present embodiment, but the number of memory cells is not limited to this. A memory cell unit CU may comprise two or more memory cells, for example, 32 or 56 memory cells.

A source line SL is connected to an end of the current path of the memory cell string via the select transistor S1. A bit line BLm-1 is connected to the other end of the current path of the memory cell string via the select transistor S2.

Word lines WL0 to WL7 are commonly connected to control gate electrodes CG of the memory cells MC0 to MC7 arranged in the first direction. Similarly, a select gate line SGS is commonly connected to gate electrodes of a plurality of select transistors S1 arranged in the first direction and a select gate line SGD is commonly connected to gate electrodes of a plurality of select transistors S2 arranged in the first direction.

A physical page PP comprises m memory cells connected to a word line WLi (i is an integer between 0 and 7).

3. CONCLUSION

As described above, according to the embodiment, power consumption can be reduced by the sleep mode by optimizing a sleep transition timing. A needless transition in which the power save obtained in the sleep mode is smaller than the power loss produced in a transition time from the active mode to the sleep mode can be reduced. If the evacuation memory is a NAND flash memory, needless writing to the evacuation memory can be avoided and the life of the evacuation memory can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a volatile memory;
a nonvolatile memory; and
a controller which is configured to
turn off a power of the volatile memory after storing data of the volatile memory in the nonvolatile memory in a first mode,
turn on the power of the volatile memory in a second mode, and
change a first timing based on second timings, the first timing being a timing switching to the first mode, the second timings being past timings switching to the second mode.

2. The system of claim 1, wherein
the controller is configured to execute a transition between the second mode and the first mode when a command is received from a host or when the controller determines by itself.

3. The system of claim 2, wherein
the controller is connectable to the host.

4. The system of claim 2, wherein
the controller changes the first timing to a time when a certain period has passed since the command is received from the host.

5. The system of claim 2, wherein
an initial value of the first timing is a time when a certain period has passed since the command is received from the host, where a new command is not received from the host during the certain period.

6. The system of claim 1, wherein
the nonvolatile memory is a NAND flash memory, and
the controller is a memory controller which controls the nonvolatile memory.

7. The system of claim 1, wherein
the controller changes the first timing to a time when a certain period has passed after a previous timing closest to a present time among the second timings.

8. The system of claim 1, wherein
the second timings include a previous timing closest to a present time.

9. The system of claim 1, wherein
the controller calculates an average of the second timings and changes the first timing based on the average.

10. The system of claim 9, wherein
the average is a weighted average obtained by assigning a greater weighting to a timing closer to a present time.

11. The system of claim 1, wherein
the controller changes the first timing, a certain period from the changed first timing corresponds to a minimum probability of occurrence of a third timing, and the third timing is a future timing of switching to the second mode.

12. The system of claim 11, wherein
the controller changes the first timing based on a histogram indicating a frequency of occurrence of the past timings.

13. The system of claim 12, wherein
the controller determines the third timing based on a range in which the frequency of occurrence of the past timings is the minimum.

14. A method of controlling the system of claim 1, the method comprising:
turning off the power of the volatile memory after storing data of the volatile memory in the nonvolatile memory in the first mode,
turning on the power of the volatile memory in the second mode, and
changing the first timing based on the second timings.

15. The system of claim 1, wherein
the second timings include a timing in which the controller receives a previous command closest to a present time.

16. A method of controlling a memory system having a volatile memory and a nonvolatile memory, the method comprising:
turning off a power of the volatile memory after storing data of the volatile memory in the nonvolatile memory in a first mode,
turning on the power of the volatile memory in a second mode, and
changing a first timing based on second timings, the first timing being a timing switching to the first mode, the second timings being past timings switching to the second mode.

17. The method of claim 16, further comprising:
switching between the second mode and the first mode when a command is received from a host or when a controller determines by itself.

18. The method of claim 16, further comprising:
changing the first timing such that a third timing does not occur during a certain period from the first timing, where the third timing is a future timing of switching to the second mode.

19. The method of claim 16, further comprising:
changing the first timing, a certain period from the changed first timing corresponding to a minimum probability of occurrence of a third timing, the third timing being a future timing of switching to the second mode.

20. A controller comprising:
a volatile memory; and
a processing portion which is configured to:
turn off a power of the volatile memory after storing data of the volatile memory in a nonvolatile memory in a first mode,
turn on the power of the volatile memory in a second mode, and
change a first timing based on second timings, the first timing being a timing switching to the first mode, the second timings being past timings switching to the second mode.

* * * * *